United States Patent
Sun et al.

(10) Patent No.: US 9,905,438 B2
(45) Date of Patent: Feb. 27, 2018

(54) METHOD OF MANUFACTURING PACKAGE SUBSTRATE AND SEMICONDUCTOR PACKAGE

(71) Applicant: Siliconware Precision Industries Co., Ltd., Taichung (TW)

(72) Inventors: Ming-Chen Sun, Taichung (TW); Chun-Hsien Lin, Taichung (TW); Tzu-Chieh Shen, Taichung (TW); Shih-Chao Chiu, Taichung (TW); Yu-Cheng Pai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/466,063

(22) Filed: Mar. 22, 2017

(65) Prior Publication Data

US 2017/0236725 A1   Aug. 17, 2017

Related U.S. Application Data

(62) Division of application No. 14/837,245, filed on Aug. 27, 2015, now Pat. No. 9,640,503.

(30) Foreign Application Priority Data

Nov. 27, 2014   (TW) .............................. 103141137 A

(51) Int. Cl.
*H01L 21/48* (2006.01)
*H01L 23/00* (2006.01)
*H01L 23/498* (2006.01)

(52) U.S. Cl.
CPC ........ *H01L 21/4853* (2013.01); *H01L 21/486* (2013.01); *H01L 23/49811* (2013.01);
(Continued)

(58) Field of Classification Search
CPC ....... H01L 21/4853; H01L 2224/48228; H01L 23/49838; H01L 23/49827;
(Continued)

(56) References Cited

U.S. PATENT DOCUMENTS 7,045,893 B1 * 5/2006 Paek ................... H01L 23/3128
257/692
2003/0189246 A1 * 10/2003 Iwaki ................... H01L 21/481
257/706

(Continued)

*Primary Examiner* — Jasmine Clark
(74) *Attorney, Agent, or Firm* — Mintz Levin Cohn Ferris Glovsky and Popeo, P.C.; Peter F. Corless; Steven M. Jensen

(57) ABSTRACT

A package substrate and a semiconductor package are provided. The package substrate includes an insulating layer having opposing first and second surfaces; a first wiring layer formed in the insulating layer, exposed from the first surface of the insulating layer, and having a plurality of first conductive pads; a second wiring layer formed in the insulating layer, exposed from the second surface, and having a plurality of second conductive pads; a third wiring layer formed on the first surface and electrically connected with the first wiring layer; a plurality of first metal bumps formed on the first conductive pads corresponding; and at least one conductive via vertically embedded in the insulating layer and electrically connected to the second and third wiring layers. Therefore, the surfaces of first conductive pads are reduced, and the non-wetting between the first conductive pads and the solder materials formed on conductive bumps is avoided.

13 Claims, 8 Drawing Sheets

(52) U.S. Cl.
CPC .. *H01L 23/49827* (2013.01); *H01L 23/49838* (2013.01); *H01L 24/16* (2013.01); *H01L 24/81* (2013.01); *H01L 2224/16238* (2013.01); *H01L 2224/81815* (2013.01)

(58) Field of Classification Search
CPC ... H01L 23/49816; H01L 24/81; H01L 24/16; H01L 23/49811; H01L 2224/16238; H01L 24/11; H01L 2224/81815; H01L 2924/181; H01L 23/5384; H01L 21/563; H01L 2224/48227; H01L 21/486
See application file for complete search history.

(56) References Cited

U.S. PATENT DOCUMENTS

| | | | |
|---|---|---|---|
| 2007/0281390 A1* | 12/2007 | Kang | H01L 21/4846 438/106 |
| 2008/0101045 A1* | 5/2008 | Jung | H01L 21/4846 361/761 |
| 2011/0139494 A1* | 6/2011 | Yu | H05K 3/107 174/255 |
| 2012/0133048 A1 | 5/2012 | Lee et al. | |
| 2013/0292831 A1 | 11/2013 | Liu et al. | |
| 2013/0320523 A1 | 12/2013 | Lee et al. | |
| 2015/0223330 A1 | 8/2015 | Oi et al. | |

* cited by examiner

METHOD OF MANUFACTURING PACKAGE SUBSTRATE AND SEMICONDUCTOR PACKAGE

CROSS-REFERENCE TO RELATED APPLICATIONS

This application is a divisional of application U.S. Ser. No. 14/837,245, filed on Aug. 27, 2015, now U.S. Pat. No. 9,640,503, which claims under 35 U.S.C. § 119(a) the benefit of Taiwanese Patent Application No. 103141137, filed on Nov. 27, 2014, the entire contents of which are incorporated herein by reference.

BACKGROUND OF THE INVENTION

1. Field of the Invention

The present invention relates to package substrates, semiconductor packages and methods of manufacturing the same, and, more particularly, to a package substrate for enhancing bonding strength, a semiconductor package and a method of manufacturing the same.

2. Description of Related Art

As the demands for high functionality of electronic products, as well as enhanced technology for package substrates having high intensity conductive pads in flip-chip type package continue to increase, several packaging types of electronic products have been developed.

FIG. 1 shows a cross-sectional view of a package substrate 1 according to the prior art. The package substrate 1 comprises an insulating layer 15, a first wiring layer 11, a second wiring layer 12, conductive vias 13, and third conductive pads 18.

The insulating layer 15 has opposing first and second surface 15a and surface 15b. The first wiring layer 11 has first conductive pads 111 embedded in and exposed from the first surface 15a. The second wiring layer 12 has second conductive pads 121 and conductive pads 122 embedded in and exposed from the second surface 15b. The insulating layer 15 has conductive vias 13 formed therein and electrically connected with the conductive pads 122. The third conductive pads 18 are formed on the first surface 15a of the insulating layer 15 and electrically connected with the conductive vias. Optionally, a conductive layer 16 is formed between the conductive pads 122 and the conductive vias 13 and between the insulating layer 15 and the conductive vias 13.

However, as the requirement for chip functionality continues to increase, the number of electrical connections required for the flip-chip to be connected to the package substrate must increases also, but this is limited by limited area for disposing the first conductive pads. Since the interface between the first conductive pads an the flip chip is a plane surface, which when reduced in surface area would result in poor bonding strength between the first conductive pads and the solder materials of the conductive bumps on the chip, as well as non-wetting problem, causing the reliability and yield of the final product to be greatly reduced.

Thus, there is an urgent need for solving the foregoing problems.

SUMMARY OF THE INVENTION

In view of the foregoing drawbacks of the prior art, the present invention provides a package substrate, comprising: an insulating layer having opposing first and second surfaces; a first wiring layer embedded in the insulating layer, exposed from the first surface, and having a plurality of first conductive pads; a second wiring layer embedded in and the insulating layer, exposed from the second surface, and having a plurality of second conductive pads; a third wiring layer formed on the first surface and electrically connected with the first wiring layer; a plurality of first metal bumps formed on the first conductive pads correspondingly; and at least one conductive via embedded in the insulating layer and electrically connected with the second wiring layer and the third wiring layer.

The present invention provides a semiconductor package, comprising: a package substrate; at least one semiconductor component formed on the package substrate in a flip chip manner; and an encapsulant formed on the package substrate and encapsulating the semiconductor components, the package substrate including: an insulating layer having opposing first and second surfaces; a first wiring layer embedded in and the insulating layer, exposed from the first surface, and having a plurality of first conductive pads; a second wiring layer embedded in the insulating layer, exposed from the second surface, and having a plurality of second conductive pads; a third wiring layer formed on the first surface and electrically connected with the first wiring layer; a plurality of first metal bumps formed on the first conductive pads correspondingly; and at least one conductive via embedded in the insulating layer and electrically connected with the second wiring layer and the third wiring layer.

The present invention further provides a method of manufacturing a package substrate, comprising: preparing a first carrier and a second carrier, the first carrier having a first wiring layer having a plurality of first conductive pads, the second carrier having a second wiring layer facing the first wiring layer having a plurality of second conductive pads; forming an insulating layer that encapsulates the first wiring layer and the second wiring layer, wherein the insulating layer has opposing first and second surfaces; removing the first carrier and the second carrier such that the first wiring layer is exposed from the first surface, and the second wiring layer is exposed from the second surface; and forming a third wiring layer on the first surface, forming first metal bumps on the first conductive pads correspondingly, and forming in the insulating layer at least one conductive via that is electrically connected with the second wiring layer and the third wiring layer.

The present invention further provides a method of manufacturing a semiconductor package, comprising: preparing a first carrier and a second carrier, the first carrier having a first wiring layer having a plurality of first conductive pads, the second carrier having a second wiring layer facing the first wiring layer having a plurality of second conductive pads; forming an insulating layer that encapsulates the first wiring layer and the second wiring layer, wherein the insulating layer has opposing first and second surfaces; removing the first carrier and the second carrier such that the first wiring layer is exposed from the first surface, and the second wiring layer is exposed from the second surface; forming a third wiring layer on the first surface, forming first metal bumps on the first conductive pads correspondingly, and forming in the insulating layer at least one conductive via that is electrically connected with the second wiring layer and the third wiring layer, so as to form the package substrate; mounting at least one semiconductor component on the package substrate in a flip chip manner; and forming on the package substrate an encapsulant that encapsulates the semiconductor component.

The package substrate, the semiconductor package, and the methods of manufacturing the same according to the present invention feature in forming the first metal bumps on the exposed surface of the first conductive pads such that the projected area of each of the first metal bumps is less than the area of the corresponding one of the exposed first conductive pads, and thus the solder material of the conductive bumps of the chip coupled to the first conductive pads after the flip-chip process can enhance the bonding strength between the first conductive pads and the conductive bumps, and therefore enables the first conductive pads to be reduced in area as well as avoids non-wetting problem during the bonding of the solder material of the conductive bumps and the first conductive pads, and as a result, the product reliability and yield can be enhanced.

DETAILED DESCRIPTION OF THE PREFERRED EMBODIMENTS

The present invention is described in the following with specific embodiments, so that one skilled in the pertinent art can easily understand other advantages and effects of the present invention from the disclosure of the present invention.

FIGS. 2A-2E are cross-sectional views illustrating a method of manufacturing a package substrate according to an embodiment of the present invention.

Figure 2A:
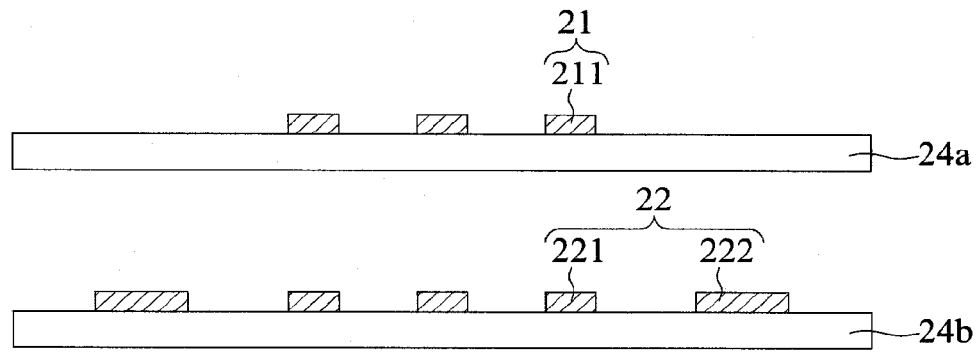
FIGS. 2A-2E are cross-sectional views illustrating a method of manufacturing a package substrate according to an embodiment of the present invention, FIGS. 2A'-1 and 2A'-2 are cross-sectional views illustrating a method of manufacturing another embodiment of the package substrate of FIG. 2A, and FIGS. 2B-1 and 2B-2 are cross-sectional views illustrating a method of manufacturing another example of the package substrate of FIG. 2B, and FIG. 2E' is a partial top view of an insulation layer of FIG. 2E.
Figure 2A:
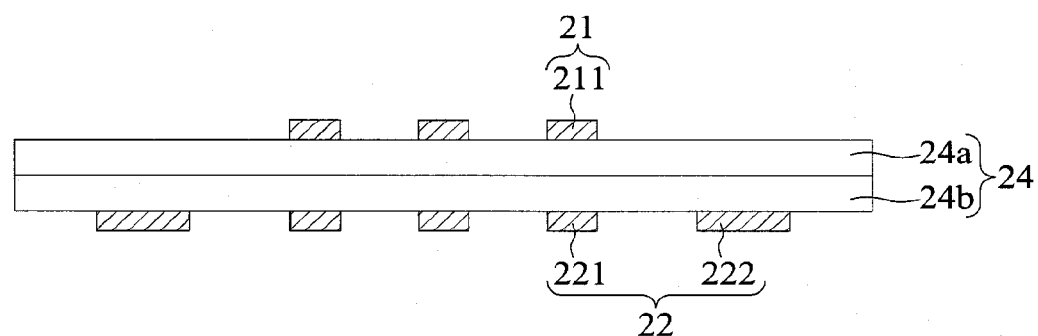
Figure 2A:
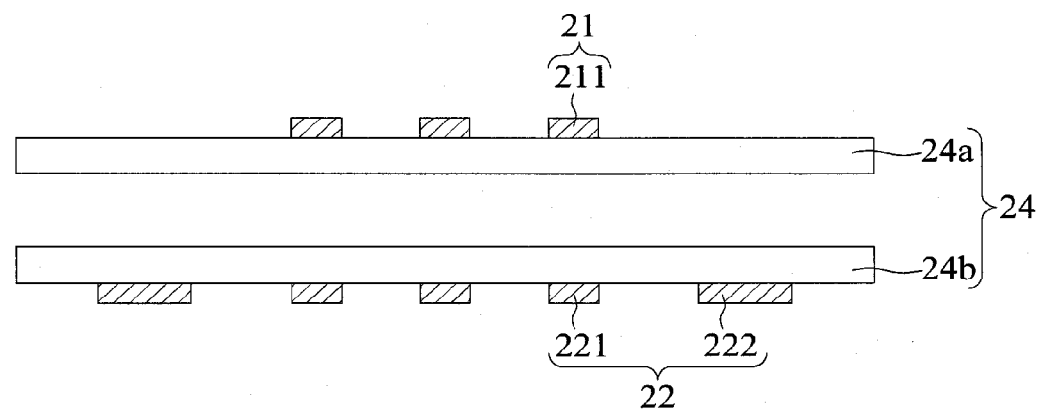

As shown in FIG. 2A, a first carrier 24a and a second carrier 24b are prepared. The first carrier 24a has a first wiring layer 21 formed thereon and having a plurality of first conductive pads 211. The second carrier 24b has a second wiring layer 22 formed thereon and having a plurality of second conductive pads 221. The first carrier 24a and second carrier 24b can also be prepared, as shown in FIG. 2A'-1, by providing a board 24 having the first carrier 24a and the second carrier 24b stacked on the first carrier 24a, the first carrier 24a including a first wiring layer 21 formed thereon and having a plurality of first conductive pads 211, the second carrier 24b including a second wiring layer 22 formed thereon and having a plurality of second conductive pads 221. Subsequently, the first and second carriers 24a and 24b are separated to have the separated first carrier 24a and second carrier 24b, as shown in FIG. 2A'-2.

More specifically, in the example of FIG. 2A'-1, an adhesion layer (not shown) is formed and interposed between the first carrier 24a and second carrier 24b of the board 24 to adhere the first carrier 24a with the second carrier 24b. When the board 24 is a single board, it can be cut into the first carrier 24a and the second carrier 24b. The second wiring layer 22 can also have conductive pads 222. The details for forming electrical connection are common knowledge in the art, therefore will not be described herein.

Figure 2B:
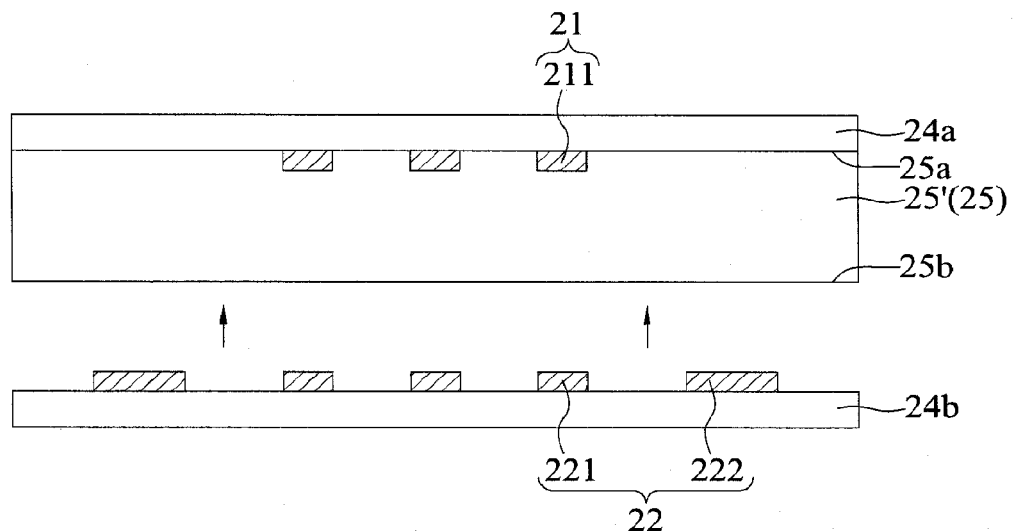
Figures 1, 2B:
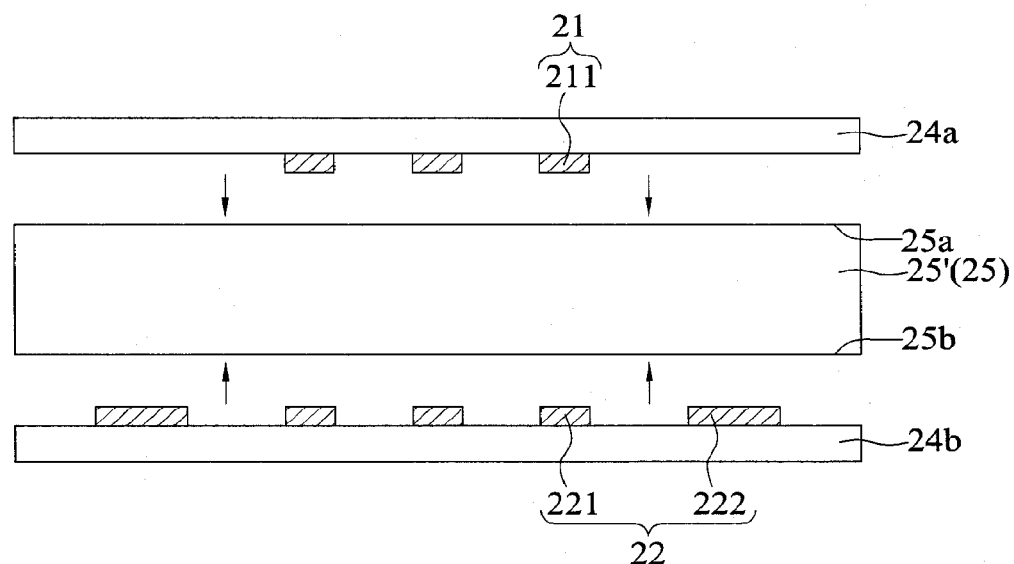
Figures 2, 2B:
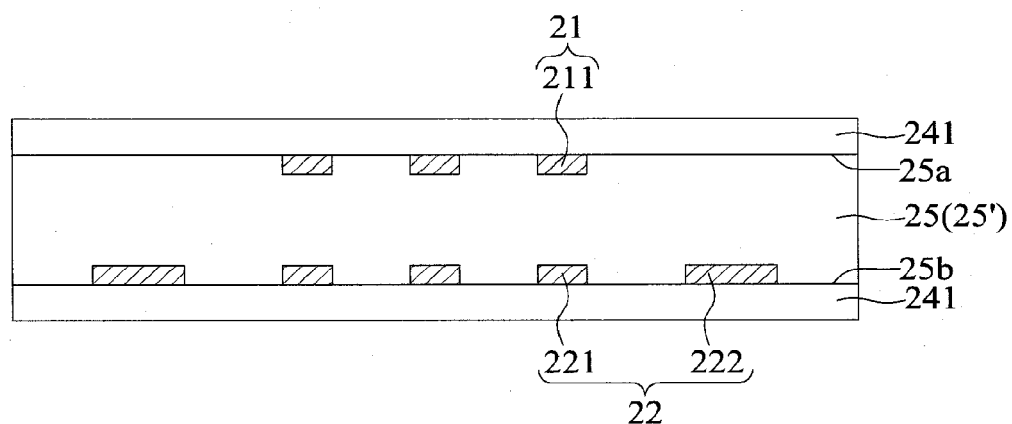

As shown in FIG. 2B-2, in the situation when the first wiring layer 21 faces the second wiring layer 22, an insulating layer 25 is formed to encapsulate the first wiring layer 21 and the second wiring layer 22, wherein the insulating layer 25 has opposing first and second surfaces 25a and 25b.

Figure 1:
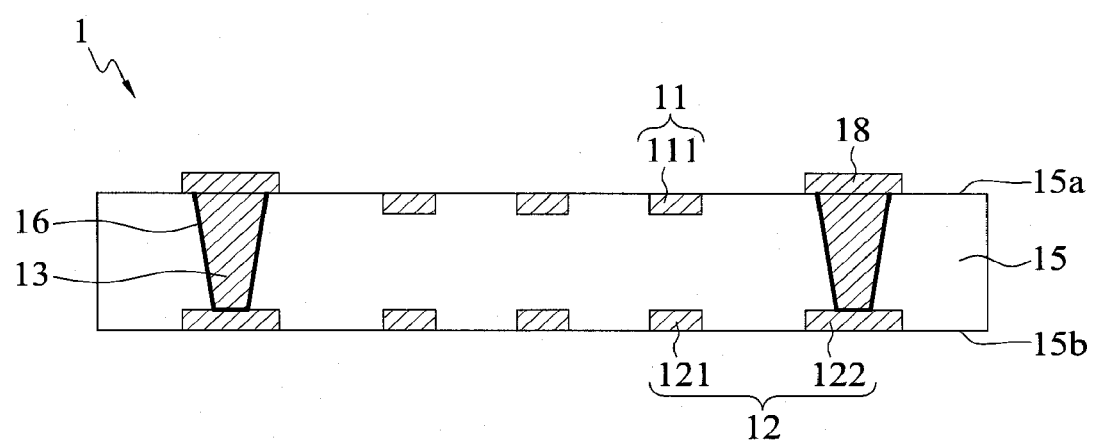
FIG. 1 is a cross-sectional view of a package substrate according to the present invention.

More specifically but not in a way limiting the present invention, an insulating material 25' of the insulating layer 25 can be also used as a dielectric material, encapsulating material or combinations of the above. The method of forming the insulating layer 25 has the following different types. For instance, an insulating material 25' can be formed on at least one of the first carrier 24a and the second carrier 24b, and the first carrier 24a and second carrier 24b are pressed, to form the insulating layer 25. Alternatively, as shown in FIG. 2B-1, an insulating material 25' can be provided, and the first wiring layer 21 and second wiring layer 22 are pressed into the insulating material 25' when the first wiring layer 21 faces the second wiring layer 22, to form the insulating layer 25. As is shown in FIG. 2B-2, the first wiring layer 21 faces the second wiring layer 22, and an insulating material 25' is filled between the first wiring layer 21 and second wiring layer 22 to form the insulating layer 25.

Figure 2C:
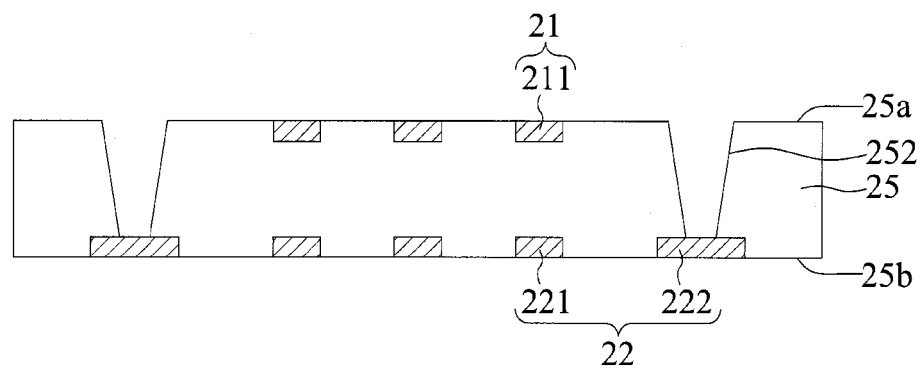

As shown in FIG. 2C, the first carrier 24a and the second carrier 24b are removed. The first wiring layer 21 is exposed from the first surface 25a, and the second wiring layer 22 is exposed from the second surface 25b.

Figure 2D:
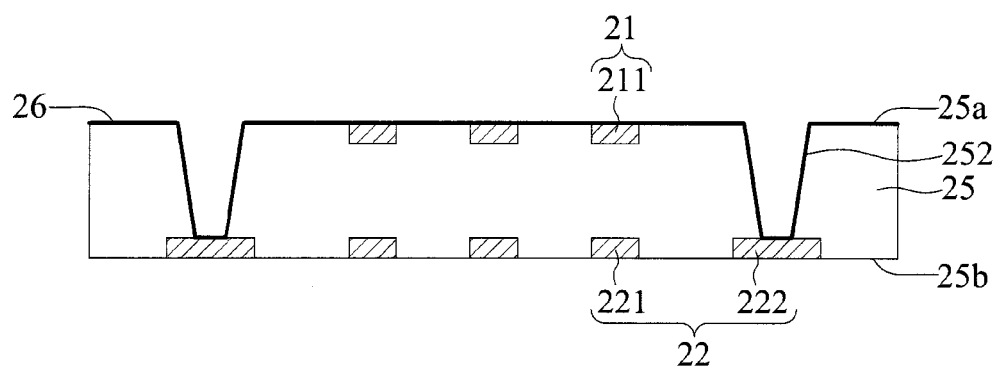

As shown in FIG. 2D, vias 252 are formed in the insulating layer 25 from the first surface 25a to expose the conductive pads 222 of the second wiring layer 22, and a conductive layer 26 can be selectively formed in the vias 252, on the conductive pads 222 exposed from the vias 252 and on the first surface 25a.

Figure 2E:
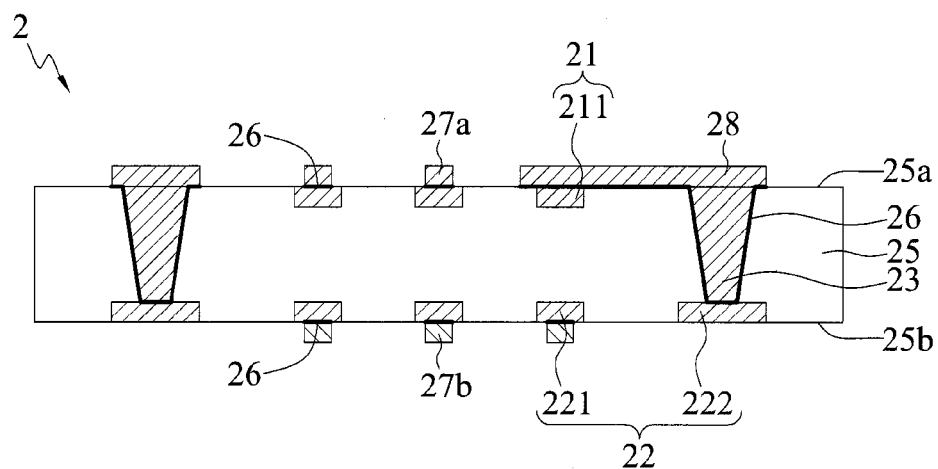
Figure 2E:
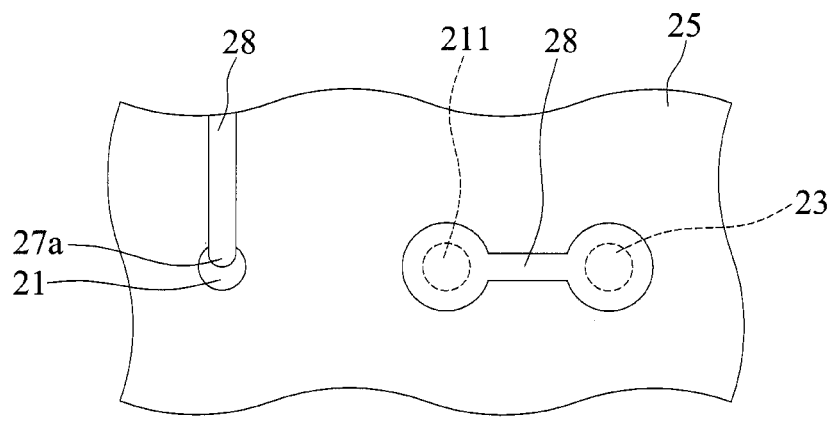

As shown in FIGS. 2E and 2E', at least one conductive via 23 that is electrically connected with the second wiring layer 22 is formed in the insulating layer 25, and a third wiring layer 28 is formed on the first surface 25aa and is electrically connected with the conductive vias 23. First metal bumps 27a are formed at a position corresponding to the first conductive pads 211, to complete the formation of the package substrate 2 of the present invention. The area of each of the first metal bumps 27a projected onto the first surface 25a is less than the area of a corresponding one of the first conductive pads 11. The method of electrically connecting the third wiring layer 28 with the first metal bumps 27a or with the first wiring layer 21 can be adjusted according to practical needs, in which the details are common knowledge to a person skilled in the art, therefore will not be described herein.

More specifically but not in a way limiting the present invention, before forming the conductive vias 23 and first metal bumps 27a, a resist layer (not shown) can be formed covering the conductive layer 26 at places where the conductive vias 23 and first metal bumps 27a are not going to be formed, and the part of the conductive layer 26 that is not formed with the conductive vias 23, the first metal bumps 27a is removed after the conductive vias 23 and first metal bumps 27a are formed. The present invention also provides selectively forming second metal bumps 27b on the second conductive pads 221 correspondingly when the first metal bumps 27a are formed, and the area of each of the second metal bumps 27b projected onto the second surface 25b is less than the area of a corresponding one of the second conductive pads 221. In addition, a conductive layer 26 is formed between the second metal bumps 27b and the second conductive pads 221, which is similar to the formation of conductive layer 26 between the first conductive pads 211 and first metal bumps 27a and therefore will not be described therein.

The present invention further provides a package substrate 2, as shown in FIG. 2E. The package substrate 2 comprises: an insulating layer 25 having opposing first and second surfaces 25a and 25b; a first wiring layer 21 embedded in the insulating layer 25, having a plurality of first conductive pads 211, and exposed from the first surface 25a; a second wiring layer 22 embedded in the insulating layer 25, having a plurality of second conductive pads 221, and exposed from the second surface 25b; a third wiring layer 28 formed on the first surface 25a and electrically connected with the first wiring layer 21; a plurality of first metal bumps 27a formed on the first conductive pads 211 correspondingly; and at least one conductive via 23 embedded in the insulating layer 25 and electrically connected with the second wiring layer 22 and third wiring layer 28. The area of each of the first metal bumps 27a projected onto the first surface 25a is less than the area of a corresponding one of the first conductive pads 211. The conductive vias 23 extend to the first surface 25a, and are coplanar with the first surface 25a. In an embodiment, the package substrate 2 further comprises a plurality of second metal bumps 27b formed on each of the second conductive pads 221 correspondingly, and the area of each of the second metal bumps 27b projected onto the second surface 25b is less than the area of a corresponding one of the second conductive pads 221.

Figure 3:
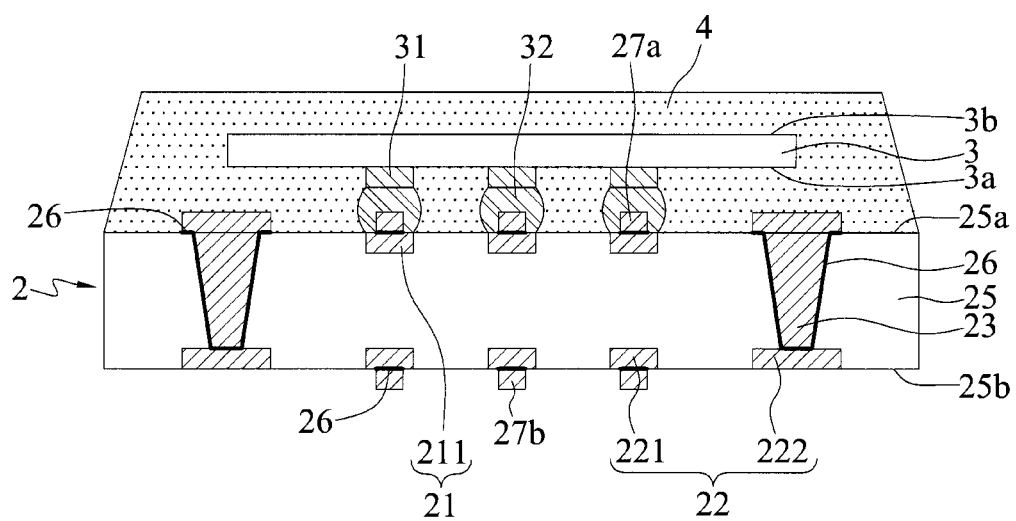
FIG. 3 is a cross-sectional view showing a semiconductor package and a method of manufacturing the same according to the present invention.

FIG. 3 is a cross-sectional view illustrating a semiconductor package 3 and a method of manufacturing the same according to the present invention. The semiconductor package shown in FIG. 2E is formed by disposing at least one semiconductor component 3 on the package substrate 2 in a flip-chip manner, and forming an encapsulant 4 over the package substrate 2 for encapsulating the semiconductor component 3. More specifically but not in a way limiting the present invention, the semiconductor component 3 has an active surface 3a and a non-active surface 3b, and conductive pillars 31 and a solder material 32 on the conductive pillars 31 can be selectively formed on the active surface 3a. The semiconductor component 3 is reflowed such that the solder material 32 encapsulate the first metal bumps 27a, allowing the semiconductor component 3 to be disposed on the first surface 25a of the package substrate 2 in a flip-chip manner, so as to complete the formation of the semiconductor package shown in FIG. 3. Alternatively, the semiconductor component 3 can be reflowed to allow the solder material 32 to encapsulates the second metal bumps 27b, allowing the semiconductor component 3 to be disposed on the second surface 25b of the package substrate 2 (not shown).

Figure 4A:
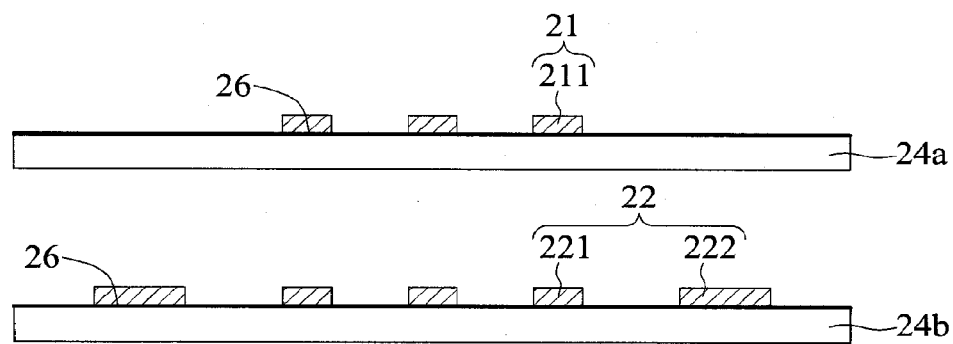
FIGS. 4A-4E are cross-sectional views illustrating a method of manufacturing a package substrate in accordance with another embodiment of the present invention.
Figure 4B:
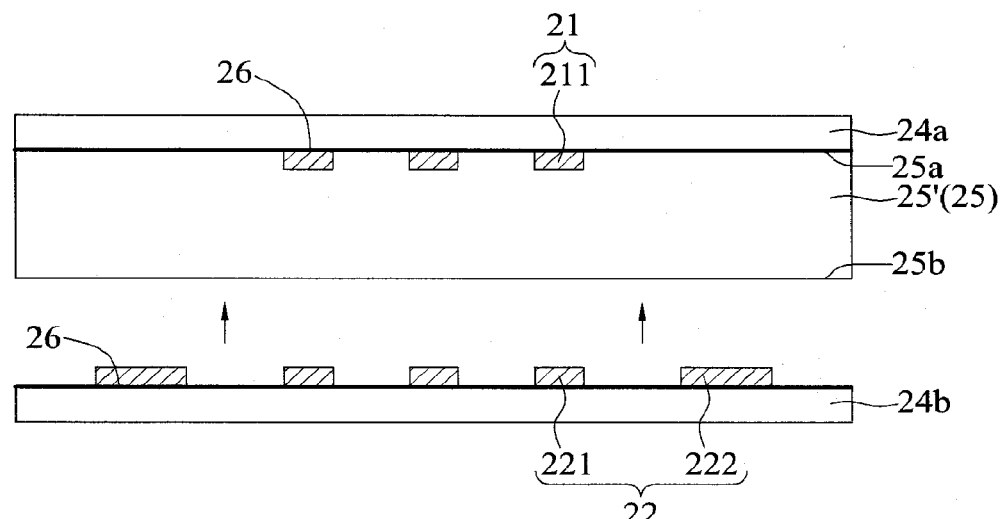
Figure 4C:
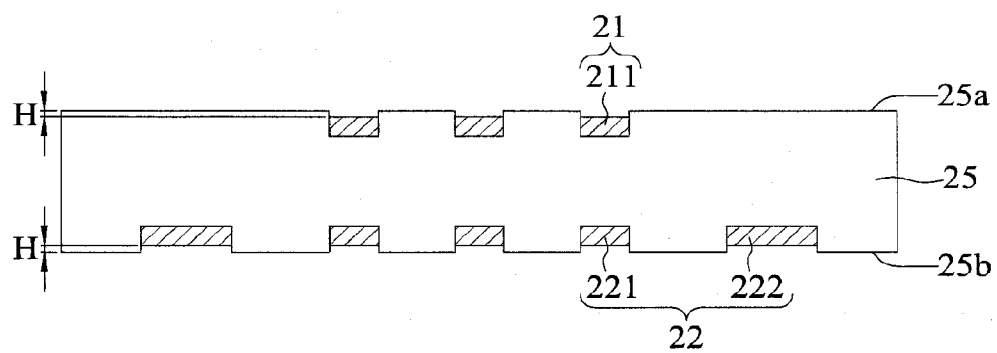
Figure 4D:
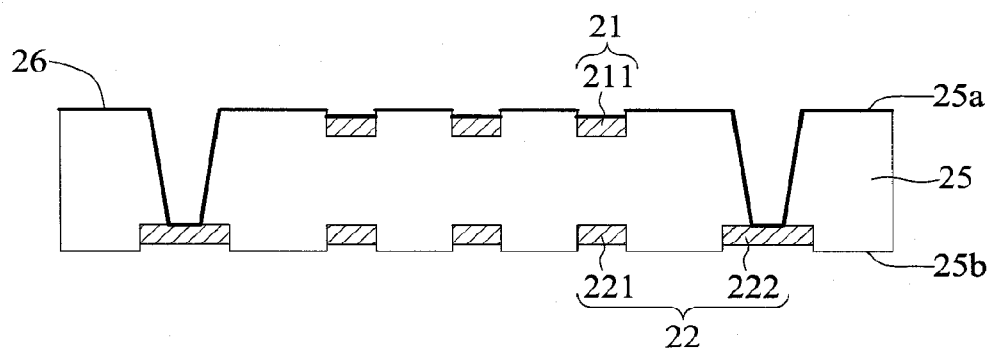
Figure 4E:
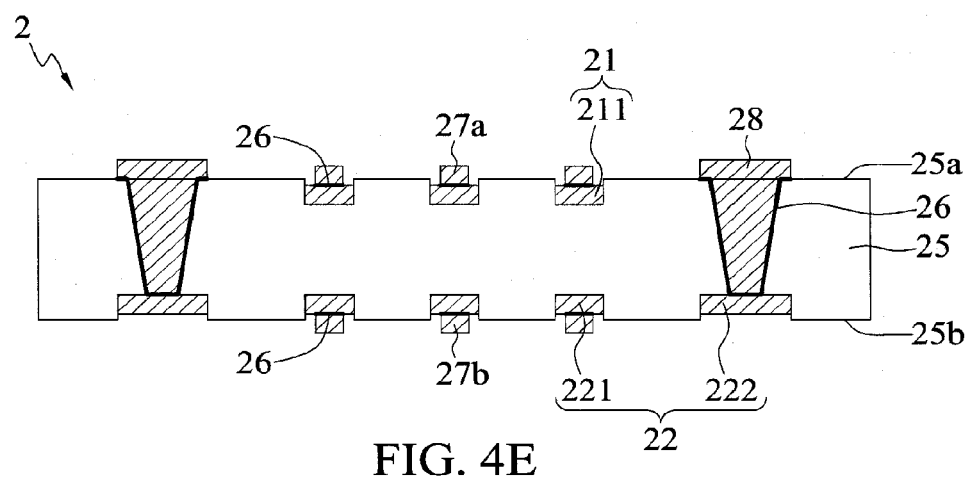

FIGS. 4A-4E are cross-sectional views illustrating a method of manufacturing a package substrate in accordance with another embodiment of the present invention. If the first wiring layer 21 and the second wiring layer 22 are formed by an electroplating method, a conductive layer 26, where the first wiring layer 21 and second wiring layer 22 are formed, can be formed on the surface of the first carrier 24a and the surface of the second carrier 24b. Therefore, as shown in FIG. 4C, after the first carrier 24a and the second carrier 24b are removed, the conductive layer is removed 26, which is the difference between FIG. 4C and FIG. 2C. Moreover, a portion of the exposed first wiring layer 21 is also removed at the same time when the conductive layer 26 is removed, as well as a part of the second wiring layer 22. Therefore, the first wiring layer 21 has an exposed surface that is lower than the surface of the first surface 25a by a step (H), and the second wiring layer 22 also has an exposed surface that is lower than the second surface 25b by the step (H). In other words, the exposed surface of the first wiring layer 21 and the first surface 25a together form a recessed part, while the surface of the second wiring layer 22 may form a recessed portion with the second surface 25b. The remaining method of manufacture is similar to that shown in FIGS. 2B, 2D and 2E, and will not be described herein. In addition, another example of the package substrate 2 according to the present invention, as shown in FIG. 4E differs from that of FIG. 2E is that there could be a step H between the exposed surface of the first wiring layer 21 and the first surface 25a, as well as between the exposed surface of the second wiring layer 22 and the second surface 25b. Both the first metal bumps 27a and second metal bumps 27b protrude from first surface 25a and second surface 25b.

Figure 5:
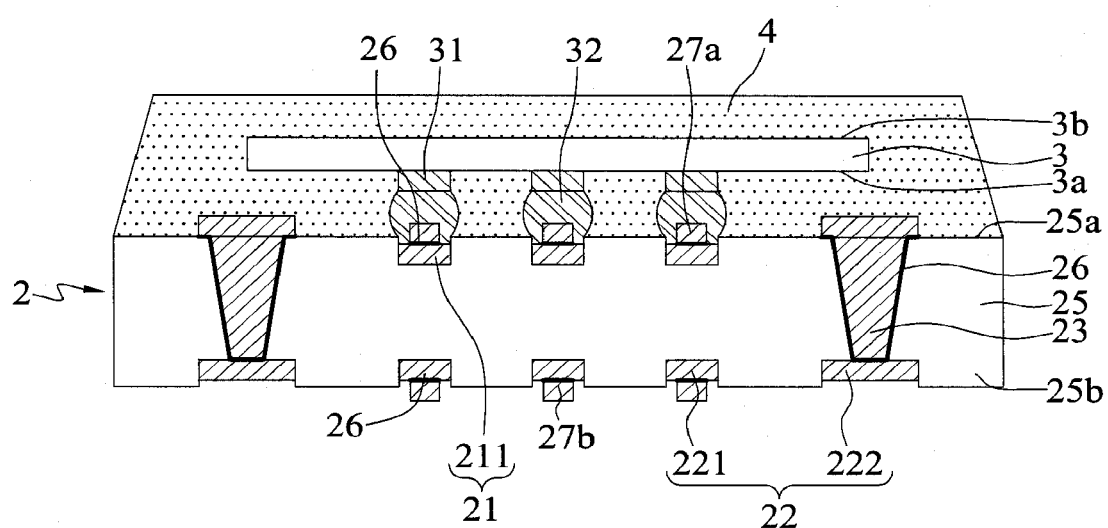
FIG. 5 is a cross-sectional view of a semiconductor package and a method of manufacturing the same in accordance with another embodiment of the present invention.

FIG. 5 is a cross-sectional view of a semiconductor package and a method of manufacturing the same in accordance with another embodiment of the present invention. FIG. 5 differs from FIG. 3 in that the first wiring layer 21 may have the exposed surface that is lower than the first surface 25a by a step H, and the second wiring layer 22 may also have the exposed surface that is lower than the second surface 25b by a step H.

In summary, as compared to the conventional technology, the present invention features in having first metal bumps (or second bumps) formed on the exposed surface of the first conductive pads (or second conductive pads), wherein the projected area thereof is less than the area of a corresponding one of the exposed first conductive pads (or second conductive pads). Therefore, in the flip-chip process the solder materials on the conductive bumps may provide enhanced bonding strength between the second conductive pads and the exposed surface of the second metal bumps, such that the area of first conductive pads or second conductive pads could be reduced to prevent the solder materials on the conductive bumps and the first conductive pads or second conductive pads from non-wetting issues during the flip-chip process, thereby enhancing product reliability and product yield.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of manufacturing a package substrate, comprising:
preparing a first carrier and a second carrier, the first carrier having a first wiring layer having a plurality of first conductive pads, and the second carrier having a second wiring layer facing the first wiring layer on the first carrier and the second carrier and having a plurality of second conductive pads;

forming an insulating layer that encapsulates the first wiring layer and the second wiring layer and has opposing first and second surfaces;

removing the first carrier and the second carrier such that the first wiring layer is exposed from the first surface, and the second wiring layer is exposed from the second surface;

forming in the insulating layer at least one conductive via that is electrically connected with the second wiring layer; and forming on the first surface a third wiring layer that is electrically connected with the at least one conductive via, and forming first metal bumps on the first conductive pads correspondingly, wherein each of the first metal bumps has an area projected onto the first surface that is less than an area of a corresponding one of the first conductive pads.

2. The method of claim 1, wherein the first carrier and the second carrier are prepared by:

providing a board having the first carrier and the second carrier stacked on the first carrier;

forming the first wiring layer having the first conductive pads on the first carrier, and forming the second wiring layer having the second conductive pads on the second carrier; and separating the first carrier and the second carrier.

3. The method of claim 1, wherein the first carrier and the second carrier have conductive layers formed on surfaces thereof, the first wiring layer and the second wiring layer are formed on the conductive layers, and after the first carrier and the second carrier are removed, the first wiring layer has a surface that is lower than the first surface, and the second wiring layer has a surface that is lower than the second surface.

4. The method of claim 1, wherein the insulating layer is formed by forming an insulating material on at least one of the first carrier and the second carrier, and pressing the first carrier and second carrier.

5. The method of claim 1, wherein the insulating layer is formed by providing an insulating material, and pressing the first wiring layer and the second wiring layer into the insulating material when the first wiring layer faces the second wiring layer, so as to form the insulating layer.

6. The method of claim 1, wherein the insulating layer is formed by filling an insulating material between the first wiring layer and the second wiring layer when the first wiring layer faces the second wiring layer.

7. The method of claim 1, further comprising forming a plurality of second metal bumps on the second conductive pads correspondingly when the first metal bumps are formed.

8. The method of claim 7, wherein each of the second metal bumps has an area projected onto the second surface that is less than an area of a corresponding one of the second conductive pads.

9. A method of manufacturing a semiconductor package, comprising:

disposing at least one semiconductor component on the package substrate of claim 1; and forming on the package substrate an encapsulant that encapsulates the semiconductor component.

10. The method of claim 9, wherein the semiconductor component is mounted on the first surface of the package substrate in a flip-chip manner.

11. The method of claim 10, wherein the semiconductor component has a solder material that encapsulates the first metal bumps.

12. The method of claim 9, wherein the semiconductor component is mounted on the second surface of the package substrate in a flip-chip manner.

13. The method of claim 12, wherein the package substrate further comprises a plurality of second metal bumps formed on each of the second conductive pads correspondingly, and the semiconductor component has a soldering material that encapsulates the second metal bumps.

\* \* \* \* \*